Aug. 24, 1965

J. L. STERLING 3,202,879

ENCAPSULATED CIRCUIT CARD

Original Filed Dec. 24, 1959

2 Sheets-Sheet 1

Aug. 24, 1965 J. L. STERLING 3,202,879

ENCAPSULATED CIRCUIT CARD

Original Filed Dec. 24, 1959 2 Sheets-Sheet 2

United States Patent Office 3,202,879

Patented Aug. 24, 1965

3,202,879

ENCAPSULATED CIRCUIT CARD

John L. Sterling, Poughkeepsie, N.Y., assignor to International Business Machines Corporation, New York, N.Y., a corporation of New York Original application Dec. 24, 1959, Ser. No. 861,989, now Patent No. 3,107,414, dated Oct. 22, 1963. Divided and this application Sept. 27, 1962, Ser. No. 226,546

3 Claims. (Cl. 317—101)

These cards are made by a process described and claimed in applicant's copending application S.N. 861,989 filed December 24, 1959, now Patent No. 3,107,414, entitled "Method of Forming Circuit Cards" of which this application is a division.

This invention relates to the fabrication of electrical apparatus and more particularly to improved circuit cards in which all but the connection points are encapsulated.

The usual printed circuit card is subject to failure due to loosening or peeling of the circuit members by vibration, and short circuiting by foreign objects or atmospheric moisture.

An object of this invention is to provide a circuit card which avoids the above disadvantage and is comprised of a plurality of layers of plastic into each of which conductive cutouts constituting one or more circuits are embedded by use of a steel rule punch and die prior to being plasticized into an encapsulated circuit with only the connection points or lands exposed.

A further object of this invention is to provide a circuit card wherein the circuit is encapsulated making it less subject to damage by vibration, moisture and foreign objects.

The foregoing and other objects, features and advantages of the invention will be apparent from the following more particular description of a preferred embodiment of the invention, as illustrated in the accompanying drawings.

In the usual form of printed circuit card a thin foil of copper is secured by adhesive to an insulating board of plastic or other well known material. Using a photoresist and a silk screen, the circuit is printed on the copper. The exposed copper is then etched away leaving the circuit outlined in copper on the plastic. A circuit of this sort is exposed to the moisture in the atmosphere and to foreign objects either of which may short out a portion of the circuit. Being held in place by an adhesive, the circuit may peel or come loose due to vibration.

The circuit board of the invention is formed by transferring the lead of a circuit out of a sheet of tinned copper into a sheet of uncured plastic by the use of inexpensive steel rule dies, as described in the above mentioned patent. The plastic sheet may be thermo setting, such as aniline formaldehyde or phenolic and the like, or a thermo plastic, such as styrene or a polyamide. A number of boards may be assembled layer on layer and then plasticized, completely encapsulating the circuits.

Figure 1:
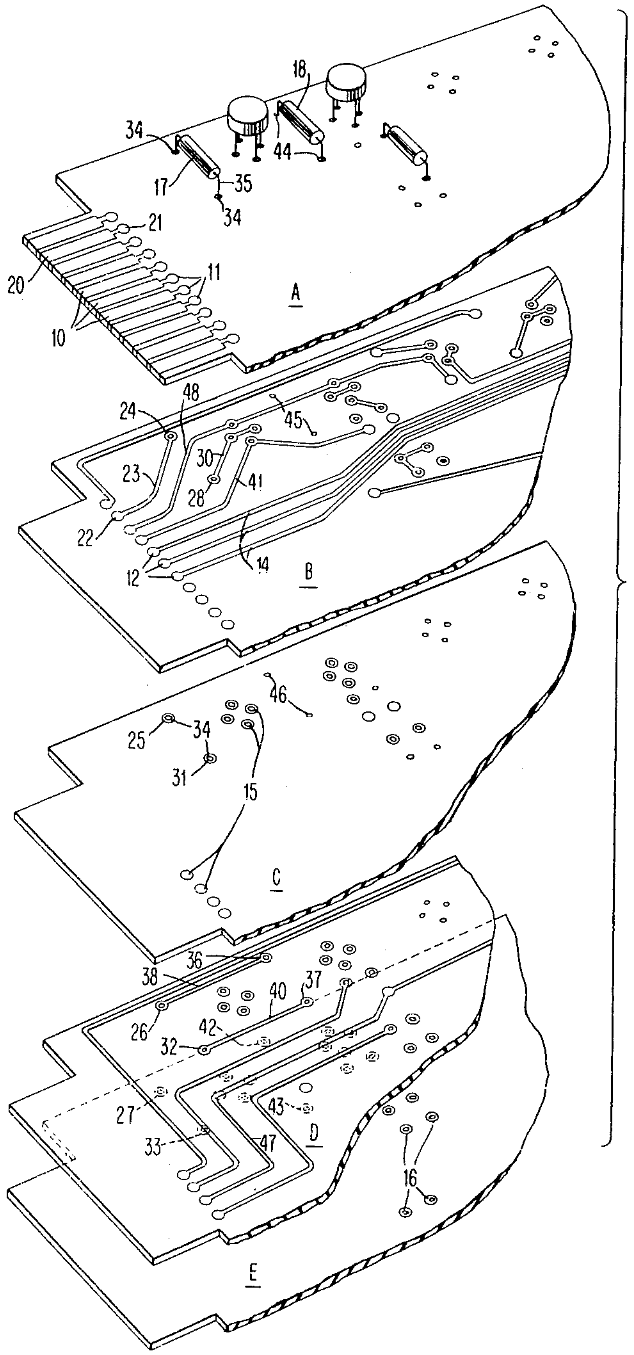
FIG. 1 is an exploded view of a circuit card according to the invention.
Figure 2:
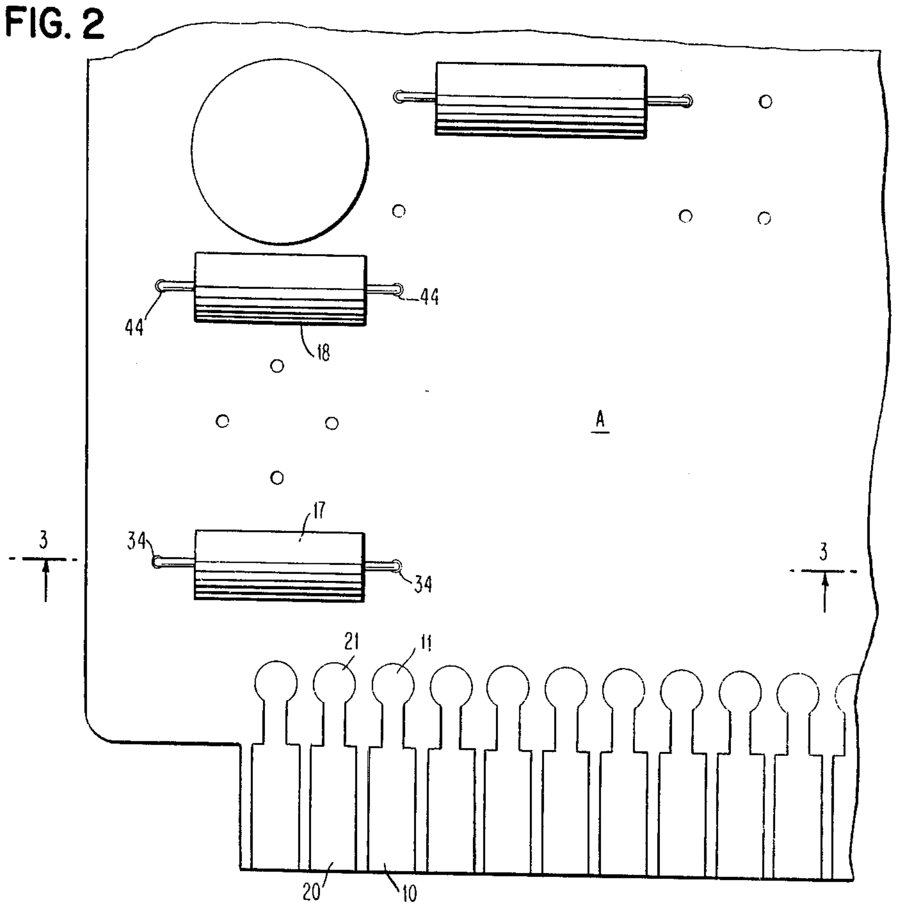
FIG. 2 is a top view of a card with some components in place.

In FIG. 1 several layers of such a circuit board are shown before plasticizing. The top plastic layer A is provided with edge contacts 10 by which the circuits in the card are connected in a well known manner to other circuit boards in a machine, such as a computer. The contacts 10 terminate in enlarged circular lands 11. A layer B has corresponding lands 12 from which the conductors or leads such as 14 go to different parts of the board. A conductor in layer D may be connected to one in layer B by lands 15 in the layer C. Also all component circuits are carried through layer E by its lands 16 to provide connection points to which component leads may be soldered.

Figure 3:
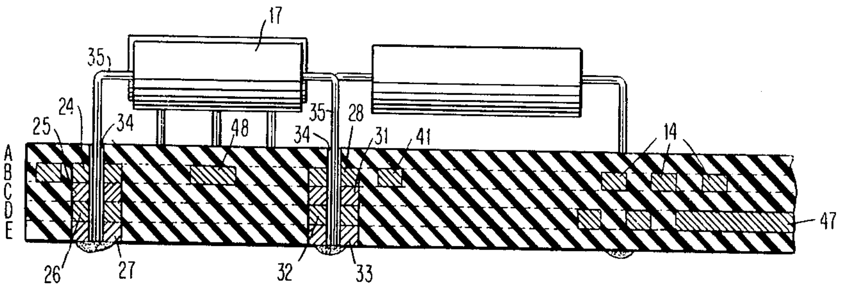
FIG. 3 is a cross section taken along line 3—3 of FIG. 2.

With reference to FIGS. 1 and 3, an example of a circuit in which a resistor 17 is bridged by a condenser 18 will be traced. The circuit enters the board through edge contact 20 and is carried by lands 21 and 22 over conductor 23 to a land 24. Lands 25, 26 and 27 carry the circuit through plastic layers C, D and E respectively. The other side of the circuit extends from land 28 over conductor 30 to a transistor. Land 28 is connected by land 31 in layer C to a land 32 in layer D and then to a land 33 in layer E. Holes 34 are formed by drilling through the layer A and lands 24, 25, 26 and 27 on one hand and layer A and lands 28, 31, 32 and 33 permit the leads 34 and 35 to be inserted and crimped over for soldering to lands 27 and 33 respectively.

Extending from lands 26 and 32 to lands 36 and 37 (layer D) are conductors 38 and 40 for bridging the condenser 18 across resistor 17. It will be noted that the conductor 40 extends under a conductor 41 in layer B and is insulated therefrom by the plastic of layer C. Lands 36 and 37 are conducted through layer E by lands 42 and 43 respectively. Holes 44, 45 and 46 are formed in layers A, B and C and holes are formed in lands 36, 37, 42 and 43 to accommodate the leads of condenser 18. The lands 42 and 43 provide soldering points for these leads. Only the lands necessary for an explanation of the invention have been indicated in layer E.

In FIG. 3 is shown a cross section of five layers of circuit that have been plasticized into a unit card or wafer. In this showing, it will be noted that conductor 47 (FIG. 1 layer D) passes under conductors 14 in layer B and is insulated therefrom by layer C.

From the above description, it is apparent that the invention provides a completely encapsulated circuit or circuits that are insulated from one another except at points of connection where they are carried through an insulating layer by a land. Also, no circuit except that needed for connecting components is exposed to moisture or the possibility of short circuit by foreign bodies.

A card of this type can be processed very economically since the steel rule dies can be made for about one third the cost of regular dies and the circuit layers are formed by a one shot operation; i.e., the transferring and embedding of the circuit cutout or chad from the copper sheet into the plastic. Also, once the layers are stacked the encapsulating and soldering of the different connections are made at one time. Thus, once the die is made there are only three operations necessary for completing a circuit card: (1) transferring and embedding the conductors of the circuit into the uncured plastic sheet by punching, (2) assembling the separate layers, and (3) plasticizing and soldering by heat and pressure.

In the claims and specification it is to be understood that the term inlay embedded as used in relation to the conductive material means a complete substitution of copper for the chad removed from the plastic sheet.

While the invention has been particularly shown and described with references to of preferred embodiment thereof, it will be understood by those skilled in the art that various changes in form and details may be made therein without departing from the spirit and scope of the invention.

What is claimed is:

1. A circuit card comprising a plurality of layers of dielectric material, holes for the leads of components formed in the first of said layers, conductive material forming the leads and lands of a circuit embedded in a second one of said layers and additional lands embedded in the third of said layers in juxtaposition to said lands in said second layer, all of said lands and leads having surfaces flush with the front and back surfaces of said layers, holes in said lands axially aligned with the holes in said first layer, and means bonding said layers in a unitary card.

2. A circuit card comprising a plurality of layers of plastic, holes for the leads of components formed in the first of said layers, conductive material forming the leads and lands of a circuit embedded in a second one of said layers and additional lands embedded in the third of said layers in juxtaposition to said lands in said second layer, all of said lands and leads having surfaces flush with the front and back surfaces of said layers, said lands being provided with holes coinciding with said holes in said first layer whereby components may be connected to said card, and means for bonding said layers in a unitary card.

3. A circuit card assembly comprising first, second, third, fourth and fifth sheets of dielectric material, conductive material forming end contacts and lands embedded in said first sheet, holes for the leads of electrical components extending through said first sheet, conductive material forming leads and lands of a circuit embedded in the second of said sheets, selected ones of said lands being in juxtaposition with the lands in said first sheet, additional lands of conductive material embedded in said third sheet in juxtaposition with the remaining lands in said second sheet, conductive material forming leads and lands of a second circuit embedded in said fourth sheet, conductive material forming lands embedded in said fifth sheet, all of said lands and leads having surfaces flush with the front and back surfaces of said layers, holes through said lands in each sheet in register with said holes in said first sheet and bonding means forming said sheets into a unitary card with all lands in contact with those on either side whereby said first and second circuits are interconnected to said edge contacts, to each other and to components secured in the holes in said lands.

References Cited by the Examiner

UNITED STATES PATENTS

| | | | |
|---|---|---|---|
| 1,939,130 | 12/33 | Mills | 317—101 |
| 2,066,876 | 1/37 | Carpenter et al. | 317—101 |
| 2,502,291 | 3/50 | Taylor et al. | 317—101 |
| 2,864,156 | 12/58 | Cardy | 174—68.5 |
| 2,876,393 | 3/59 | Tally et al. | 317—101 |
| 2,889,532 | 6/59 | Slack | 339—17 |
| 2,932,772 | 4/60 | Bowman et al. | 317—101 |
| 2,948,834 | 8/60 | Kalfaian | 317—101 |
| 3,029,495 | 4/62 | Doctor | 317—101 |

JOHN F. BURNS, *Primary Examiner.*